(12) United States Patent
Yoon et al.

(10) Patent No.: US 8,870,402 B2
(45) Date of Patent: Oct. 28, 2014

(54) BACKLIGHT ASSEMBLY HAVING LIGHT EMITTING DIODE PACKAGE AND DISPLAY APPARATUS HAVING THE SAME

(75) Inventors: Juyoung Yoon, Seoul (KR); Hee-Kwang Song, Suwon-si (KR)

(73) Assignee: Samsung Display Co., Ltd. (KR)

( * ) Notice: Subject to any disclaimer, the term of this patent is extended or adjusted under 35 U.S.C. 154(b) by 425 days.

(21) Appl. No.: 13/204,565

(22) Filed: Aug. 5, 2011

(65) Prior Publication Data

US 2012/0075835 A1 Mar. 29, 2012

(30) Foreign Application Priority Data

Sep. 29, 2010 (KR) .......................... 10-2010-0094622

(51) Int. Cl.
*G09F 13/04* (2006.01)
*G02F 1/1335* (2006.01)

(52) U.S. Cl.
CPC ................... *G02F 1/133603* (2013.01); *G02F 2001/133628* (2013.01); *G02F 2001/133612* (2013.01)
USPC .... 362/97.3; 362/97.1; 362/227; 362/249.02; 362/294; 362/373

(58) Field of Classification Search
USPC ................. 362/97.1, 97.3, 227, 234, 249.01, 362/249.02, 294, 373
See application file for complete search history.

(56) References Cited

U.S. PATENT DOCUMENTS

2007/0045649 A1* 3/2007 Chen .............................. 257/99

FOREIGN PATENT DOCUMENTS

| CN | 201502997 U | 6/2010 |
|----|-------------|--------|
| CN | 201526111 U | 7/2010 |
| CN | 101807568 A | 8/2010 |
| CN | 201549531 U | 8/2010 |
| CN | 101828275 A | 9/2010 |
| CN | 101839427 A | 9/2010 |
| CN | 201568775 U | 9/2010 |
| JP | 2010-003756 | 1/2010 |
| KR | 10-2005-0014769 A | 2/2005 |
| KR | 10-2009-0072941 A | 7/2009 |
| KR | 10-2010-0030805 A | 3/2010 |
| TW | 200709462 A | 3/2007 |
| WO | 2010100796 A1 | 9/2010 |

* cited by examiner

*Primary Examiner* — Meghan Dunwiddie
(74) *Attorney, Agent, or Firm* — Innovation Counsel LLP

(57) ABSTRACT

A backlight assembly includes a first light emitting unit having a first light emitting diode, a second light emitting unit having a second light emitting diode, a third heat conduction member, and a receiving container accommodating the first light emitting unit and the second light emitting unit. The first light emitting unit includes a first heat conduction member connected to the first light emitting diode to absorb a heat from the first light emitting diode, and the second light emitting unit includes a second heat conduction member connected to the second light emitting diode to absorb a heat from the second light emitting diode. A third heat conduction member is connected to the first and second heat conduction members to discharge the heats from the first and second light emitting diodes.

27 Claims, 6 Drawing Sheets

BACKLIGHT ASSEMBLY HAVING LIGHT EMITTING DIODE PACKAGE AND DISPLAY APPARATUS HAVING THE SAME

CROSS-REFERENCE TO RELATED APPLICATION

This application relies for priority upon Korean Patent Application No. 2010-94622 filed on Sep. 29, 2010, the contents of which are herein incorporated by reference in its entirety.

BACKGROUND

1. Field of Disclosure

The subject matter described relates to a backlight assembly having a light emitting diode package and a display apparatus having the backlight assembly as a light source thereof. More particularly, the subject matter relates to a backlight assembly capable of preventing variation of color coordinate of a light and a display apparatus having the backlight assembly.

2. Description of the Related Art

In general, a light emitting diode package includes a plurality of light emitting diodes emitting different color lights mixed together to emit a white light. However, as the emitting time of each light emitting diode increases the heat generated by the diode also increases so that the intensity of the light emitted from each light emitting diode becomes weaker, and the color coordinate of the white light varies in the light emitting diode package.

SUMMARY

Although various embodiments are described herein, in accordance with one exemplary embodiment, a backlight assembly may include a first light emitting unit, a second light emitting unit, a third heat conduction member, and a receiving container receiving the first and second light emitting units.

The first light emitting unit may include a first light emitting diode and a first heat conduction member that is electrically connected to the first light emitting diode to absorb heat generated from the first light emitting diode. The second light emitting unit may include a second light emitting diode and a second heat conduction member that is electrically connected to the second light emitting diode to absorb heat generated from the second light emitting diode. In addition, the third heat conduction member may be connected to the first heat conduction member and the second heat conduction member to discharge the heat generated from the first and second heat conduction members.

According to the above, the heat generated from the first light emitting diode and absorbed by the first heat conduction member and the heat generated from the second light emitting diode and absorbed by the second heat conduction member may be maintained in a thermal equilibrium state by the third heat conduction member and easily discharged to the exterior. Thus, although the light emitting time increases, the light intensity variation of the first and second diodes, which is caused by the heat, may be prevented. In addition, the decrease in the amount of the light intensity variation of the first light emitting diode may be equal to the decrease in the amount of the light intensity variation of the second light emitting diode, so that the change of the color coordinate of the light emitted from the light emitting diode package may be prevented.

BRIEF DESCRIPTION OF THE DRAWINGS

The subject matter described herein will become readily apparent by reference to the following detailed description when considered in conjunction with the accompanying drawings wherein.

DETAILED DESCRIPTION

Figure 1:
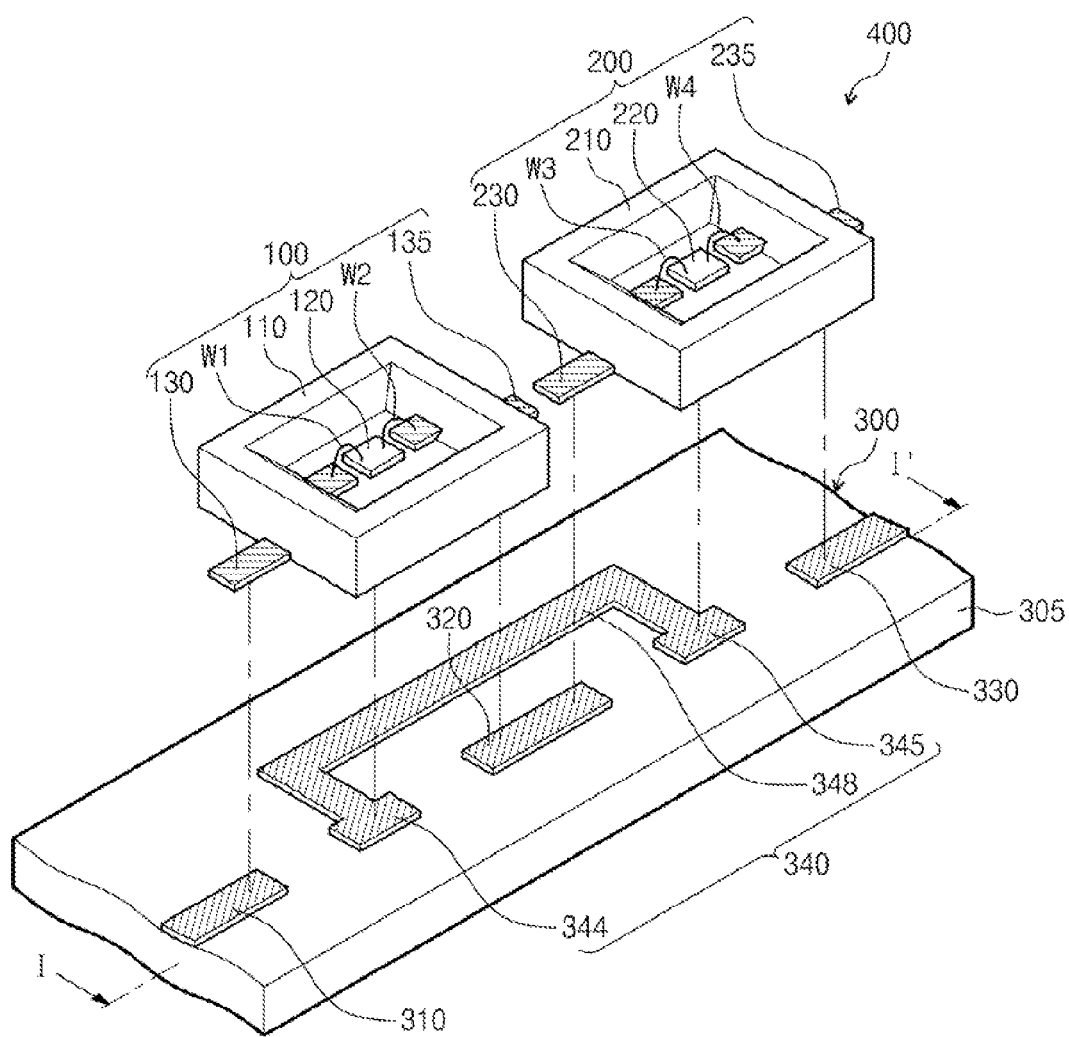
FIG. 1 is a perspective view showing a light emitting diode package according to an exemplary embodiment.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the subject matter will be explained in detail with reference to the accompanying drawings.

Figure 2:
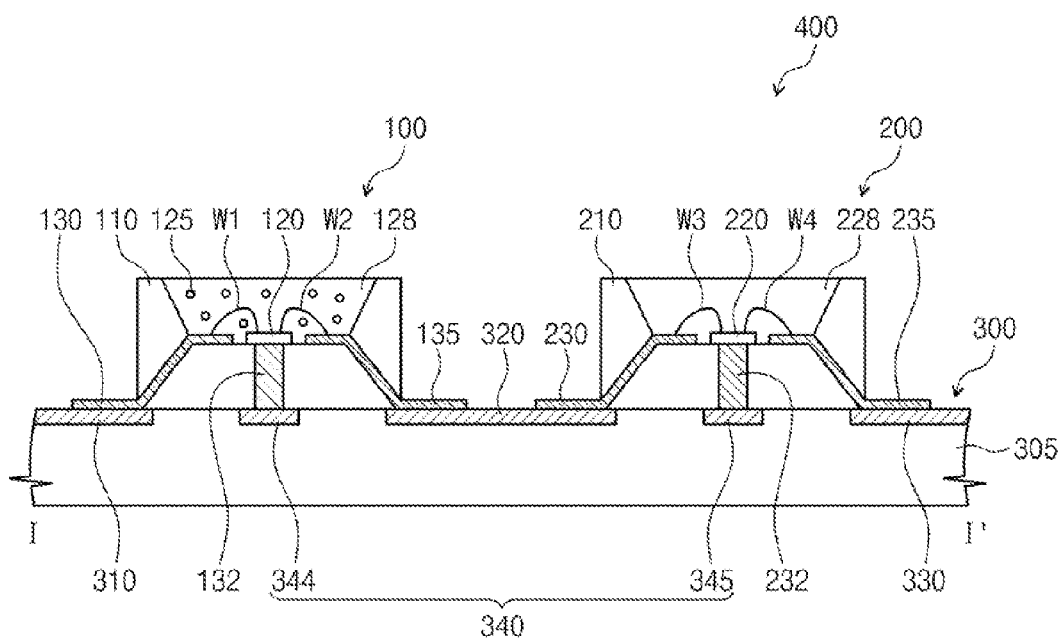
FIG. 2 is a cross-sectional view taken along a line I-I' of FIG. 1.

FIG. 1 is a perspective view showing a light emitting diode package according to an exemplary embodiment, and FIG. 2 is a cross-sectional view taken along a line I-I' of FIG. 1.

Referring to FIGS. 1 and 2, a light emitting diode package 400 includes a first light emitting unit 100, a second light emitting unit 200, and a circuit substrate 300. In the present exemplary embodiment, the light emitting diode package 400 may emit a white light by mixing a light emitted from the first light emitting unit 100 with a light emitted from the second light emitting unit 200.

The first light emitting unit 100 includes a first mold 110, a first light emitting diode 120, a first terminal 130, a second terminal 135, a first heat conduction member 132, a first wire W1, a second wire W2, a first protective layer 128, and a fluorescent substance 125.

The first mold 110 includes a receiving space therein and its upper portion is opened. The first light emitting diode 120 is received in the receiving space and receives a power source voltage from the circuit substrate 300 to emit a light. In the present exemplary embodiment, the first light emitting diode 120 may be an InGaN-based compound semiconductor chip, a GaN-based compound semiconductor chip, or an AlGaN-based compound semiconductor chip.

The first protective layer 128 fills the receiving space to cover the first light emitting diode 120. The first protective layer 128 may include an epoxy resin or a silicon resin having a superior light transmittance. The fluorescent substance 125 receives a part of a blue light emitted from the first light emitting diode 120 and converts the part of the blue light into a light having a wavelength different from that of the blue light. As an example, the fluorescent substance 125 may convert the blue light into a red light. In addition, the fluorescent substance 125 may be formed in particles and distributed in the first protective layer 128.

The first terminal 130 includes a first end accommodated in the first mold 110 and a second end withdrawn outside the first mold 110. Similar to the first terminal 130, the second terminal 135 includes a first end accommodated in the first mold 110 and a second end withdrawn outside the first mold 110.

The first wire W1 electrically connects a positive electrode (not shown) of the first light emitting diode 120 to the first terminal 130 and the second wire W2 electrically connects a negative electrode (not shown) of the first light emitting diode 120 to the second terminal 135.

The first heat conduction member 132 is surrounded by the first mold 110 and positioned under the first light emitting diode 120. The first heat conduction member 132 absorbs the heat generated from the first light emitting diode 120. In the present exemplary embodiment, the first heat conduction member 132 may include a metal material having superior heat conductivity such as a copper, and the first heat conduction member 132 may directly make contact with the first light emitting diode 120.

The second light emitting unit 200 includes a second mold 210, a second light emitting diode 220, a third terminal 230, a fourth terminal 235, a second heat conduction member 232, a third wire W3, a fourth wire W4, and a protective layer 228.

The second mold 210 includes a receiving space therein and its upper portion is opened. The second light emitting diode 220 is accommodated in the receiving space and receives a power source voltage from the circuit substrate 300 to emit a light. The receiving space of the second mold 210 is filled with the second protective layer 228 and the second light emitting diode 220 is covered by the second protective layer 228.

The third terminal 230 includes a first end accommodated in the second mold 210 and a second end withdrawn outside the second mold 210. The third terminal 230 faces the second terminal 135 in an area between the first terminal 130 and the forth terminal 235. In addition, the fourth terminal 235 includes a first end accommodated in the second mold 210 and a second end withdrawn outside the second mold 210.

The third wire W3 electrically connects a positive electrode (not shown) of the second light emitting diode 220 to the third terminal 230 and the fourth wire W4 electrically connects a negative electrode (not shown) of the second light emitting diode 220 to the fourth terminal 235.

The second heat conduction member 232 is surrounded by the second mold 210 and positioned under the second light emitting diode 220. In addition, the second heat conduction member 232 absorbs the heat generated from the second light emitting diode 220. In the present exemplary embodiment, the second heat conduction member 232 may include a metal material having superior heat conductivity such as a copper, and the second heat conduction member 232 may directly make contact with the first light emitting diode 220.

Meanwhile, in the present exemplary embodiment, the first light emitting diode 120 emits the blue light, the second light emitting diode 220 emits a green light, and the fluorescent substance 125 receives the blue light and converts the blue light into the red light. Accordingly, the light emitting diode package 400 may emit the white light into which the blue light, the red light, and the green light are mixed.

The circuit substrate 300 includes an insulation part 305, a first conductive pattern 310, a second conductive pattern 320, and a third conductive pattern 330, which are disposed on the insulation part 305, to supply the power source voltage to the first light emitting unit 100 and the second light emitting unit 200.

The first conductive pattern 310 is electrically connected to the first terminal 130, the second conductive pattern 320 is electrically connected to the second and third terminals 135 and 230, and the third conductive pattern 330 is electrically connected to the fourth terminal 235. Although not shown in FIGS. 1 and 2, each of the first and third conductive patterns 310 and 330 is electrically connected to a power supply part (not shown) disposed on the circuit substrate 300 and receives the power source voltage from the power supply part.

In addition, a third heat conduction member 340 is disposed on the insulation part 305 and spaced apart from the first, second, and third conductive patterns 310, 320, and 330. The third heat conduction member 340 may include a material having superior heat conductivity such as copper. The third heat conduction member 340 includes a first connection portion 344 connected with the first heat conduction member 132, a second connection portion 345 connected with the second heat conduction member 232, and a third connection portion 348 connected between the first connection portion 344 and the second connection portion 348.

The first heat conduction member 132 absorbs the heat emitted from the first light emitting diode 120, and thus the first heat conduction member 132 has a first heat at a first temperature. The second heat conduction member 232 absorbs the heat emitted from the second light emitting diode 220, so the second heat conduction member 232 has a second heat at a second temperature. On the assumption that the third heat conduction member 340 has a temperature lower than the first and second temperatures, the first and second heats respectively transmitted to the first and second heat conduction members 132 and 232 may be transmitted to the third heat conduction member 340. As a result, the heat transmitted to the third heat conduction member 340 may be easily discharged to the exterior.

Thus, the first and second temperatures of the heat transmitted to the first and second heat conduction members 132 and 232 may be reduced, and the temperature difference between the first and second temperatures may be reduced.

Each of the first and second light emitting diodes 120 and 220 has a structure in which a p-type semiconductor and an n-type semiconductor are stacked, and the first and second temperatures may be associated with the heat generated at the p-n junction portion between the p-type semiconductor and the n-type semiconductor. However, as the temperature of the p-n junction portion increases, the intensity of the light emitted from the first and second light emitting diodes 120 and 220 may be reduced. Thus, as described above, as the light emitting time increases the first and second temperatures are lowered by the third heat conduction member 340 to prevent the light intensity of the light emitting diodes 120 and 220 from being reduced.

In addition, the first and second temperatures may reach a thermal equilibrium state by the third heat conduction member 340. The thermal equilibrium state related to the first and second temperatures will be described with reference to FIG. 8.

Figure 8:
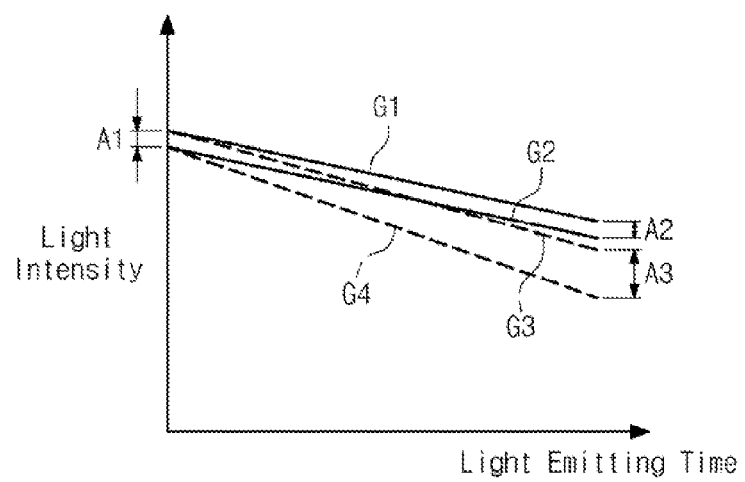
FIG. 8 is a graph showing a light intensity variation according to a light emitting time of each of first and second light emitting units shown in FIG. 1.

FIG. 8 is a graph showing a light intensity variation according to a light emitting time of each of first and second light emitting units shown in FIG. 1.

Referring to FIGS. 1, 2, and 8, a first graph G1 shows the light intensity variation according to the light emitting time of the first light emitting diode 120 and a second graph G2 show the light intensity variation according to the light emitting time of the second light emitting diode 220.

In addition, a third graph G3 and a fourth graph G4 shows the light intensity variation according to the light emitting time of the light emitting diode package 400 that does not include the third heat conduction member 340. Particularly, the third graph G3 shows the light intensity variation according to the light emitting time of the first light emitting diode 120 and the fourth graph G4 shows the light intensity variation according to the light emitting time of the second light emitting diode 220.

Referring to the first and third graphs G1 and G3, since the heat generated from the first light emitting diode 120 may be easily discharged to the exterior, the light intensity variation of the first light emitting diode 120 according to the increase of the light emitting time is relatively smaller than when the light emitting diode package 400 does not include the third heat conduction member 340. In addition, referring to the second and fourth graphs G2 and G4, the light intensity variation of the second light emitting diode 220 according to the increase of the light emitting time is relatively smaller than when the light emitting diode package 400 does not include the third heat conduction member 340. Accordingly, the light emitting intensity of the first and second light emitting diodes 120 and 220 may be increased by the third heat conduction member 340.

Referring to the first and second graphs G1 and G2 again, when the difference between the light intensity of the first light emitting diode 120 and the light intensity of the second light emitting diode 220 at the first timing at which the first and second light emitting diodes 120 and 220 start to emit the light is referred to as a first light intensity A1 and the difference between the light intensity of the first light emitting diode 120 and the light intensity of the second light emitting diode 220 at the timing after the lapse of the light emitting time of about "t" is referred to as a second light intensity A2, the first light intensity A1 may be substantially equal to the second light intensity A2. This is because the heat generated from the first light emitting diode 120 and the heat generated from the second light emitting diode 220 may be maintained in the thermal equilibrium state by the third heat conduction member 340 that connects the first heat conduction member 132 and the second heat conduction member 232. As a result, the decrease in the amount of the light intensity variation of the first light emitting diode 120 according to the light emitting time of the first light emitting diode 120 may be the same the decrease in the amount of the light intensity variation of the second light emitting diode 220 according to the light emitting time of the second light emitting diode 220.

As described above, in the case that the decrease in the amount of the light intensity variation of the first light emitting diode 120 according to the light emitting time of the first and second light emitting diodes 120 and 220 is equal to the decrease in the amount of the light intensity variation of the second light emitting diode 220 according to the light emitting time of the first and second light emitting diodes 120 and 220, the light emitted from the first light emitting unit 100 and the light emitted from the second light emitting unit 200 may be uniformly mixed with each other. Accordingly, the change of the color coordinate of the light emitted from the light emitting diode package 400 may be prevented.

Meanwhile, referring to the third and fourth graphs G3 and G4 again, when the difference between the light intensity of the first light emitting diode 120 and the light intensity of the second light emitting diode 220 at the first timing at which the first and second light emitting diodes 120 and 220 start to emit the light is referred to as the first light intensity A1 and the difference between the light intensity of the first light emitting diode 120 and the light intensity of the second light emitting diode 220 at the timing after the lapse of the light emitting time of about "t" is referred to as a third light intensity A3, the difference between the first light intensity A1 and the third light intensity A3 exists. The reason is as follows.

In the case that the light emitting diode package 400 does not include the third heat conduction member 340, the heat generated from the first light emitting diode 120 and the heat generated from the second light emitting diode 220 are not interchanged with each other. Accordingly, the decrease in the amount of the light intensity variation of the first light emitting diode 120 according to the light emitting time of the first light emitting diode 120 may be different from the decrease in the amount of the light intensity variation of the second light emitting diode 220 according to the light emitting time of the second light emitting diode 220.

This is because a current amount applied to the first light emitting diode 120 is different from a current amount applied to the second light emitting diode 220. In general, a light-emitting efficiency of a light emitting diode that emits a blue light may be lower than a light-emitting efficiency of a light emitting diode that emits a green light. Thus, the current amount applied to the first light emitting diode 120 may be larger than the current amount applied to the second light emitting diode 220, so that the temperature of the p-n junction portion in the first light emitting diode 120 may be higher than the temperature of the p-n junction portion in the second light emitting diode 220. As a result, the decrease in the amount of the light intensity variation of the first light emitting diode 120 according to the light emitting time of the first light emitting diode 120 may be larger than the decrease in the amount of the light intensity variation of the second light emitting diode 220 according to the light emitting time of the second light emitting diode 220.

As described with reference to FIGS. 1, 2, and 8, however, since the heat generated from the first light emitting diode 120 and the heat generated from the second light emitting diode 220 may be maintained in the thermal equilibrium state by the third heat conduction member 340, and the third heat conduction member 340 discharges the heat to the exterior, the change of the color coordinate of the light emitted from the light emitting diode package 400 may be prevented.

Figure 3:
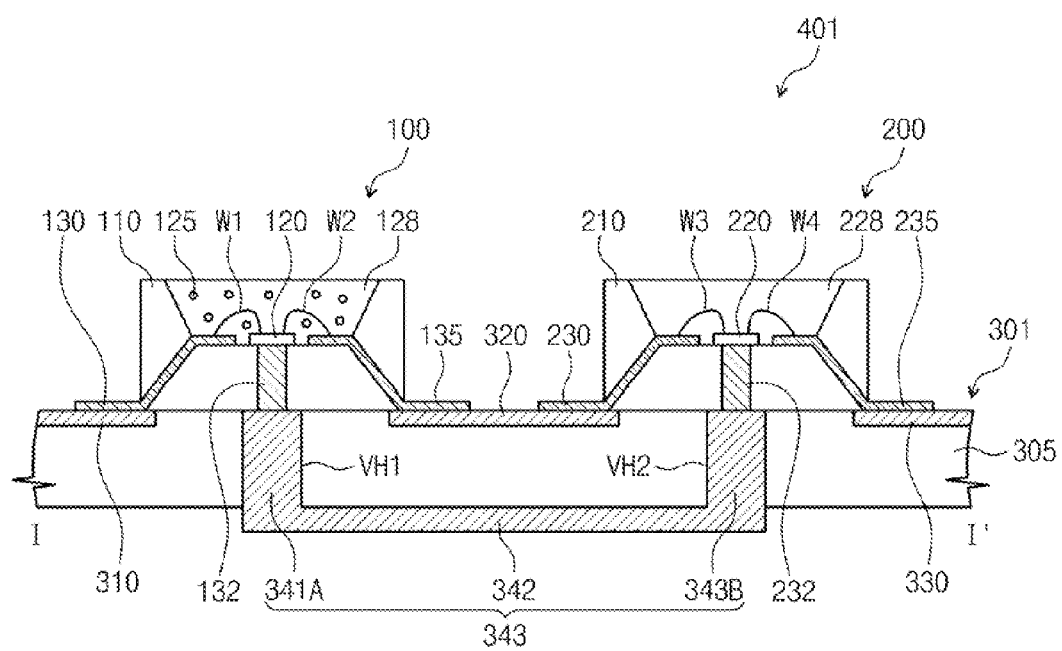
FIG. 3 is a cross-sectional view a light emitting diode package according to another exemplary embodiment.

FIG. 3 is a cross-sectional view a light emitting diode package according to another exemplary embodiment. In the present exemplary embodiment, a light emitting diode package 401 shown in FIG. 3 includes a circuit substrate 301 having a structure different from that of the circuit substrate 300 shown in FIGS. 1 and 2. Accordingly, the circuit substrate 301 will be mainly described with reference to FIG. 3, and other elements in FIG. 3 will be assigned the same reference numerals in FIGS. 1 and 2. In addition, detailed descriptions of the same elements will be omitted.

Referring to FIG. 3, the light emitting diode package 401 includes a first light emitting unit 100, a second light emitting unit 200, and a circuit substrate 301.

The circuit substrate 301 includes an insulation part 305, a first conductive pattern 310, a second conductive pattern 320, a third conductive pattern 330, and a third heat conductive member 343. The insulation part 305 is provided with a first via hole VH1 and a second via hole VH2 formed therethrough, and the first and second via holes VH1 and VH2 are positioned at positions corresponding to the first heat conductive member 132 and the second heat conductive member 232, respectively.

The third heat conductive member 343 includes a first connection portion 341A, a second connection portion 341B, and a third connection portion 342. The first connection portion 341A is accommodated in the first via hole VH1 and makes contact with the first heat conductive member 132, and the second connection portion 341B is accommodated in the second via hole VH2 and makes contact with the second heat conductive member 232. In addition, the third connection portion 342 is connected to the first connection portion 341A and the second connection portion 341B and disposed on a rear surface of the insulation part 305. According to the third heat conductive member 343, the heats generated from the first and second heat conductive members 132 and 232 are transmitted to the third heat conductive member 343 through the first and second connection portions 341A and 341B and discharged to the exterior through the third heat conductive member 343. Further, since the third heat conductive member 343 is disposed on the rear surface of the insulation part 305, the circuit substrate 305 may be reduced in size.

Meanwhile, in the present exemplary embodiment with reference to FIG. 3, the first heat conductive member 132 and the second heat conductive member 232 make contact with the third heat conductive member 342. However, the first heat conductive member 132, the second heat conductive member 232, and the third heat conductive member 343 may be integrally formed with each other.

Figure 4:
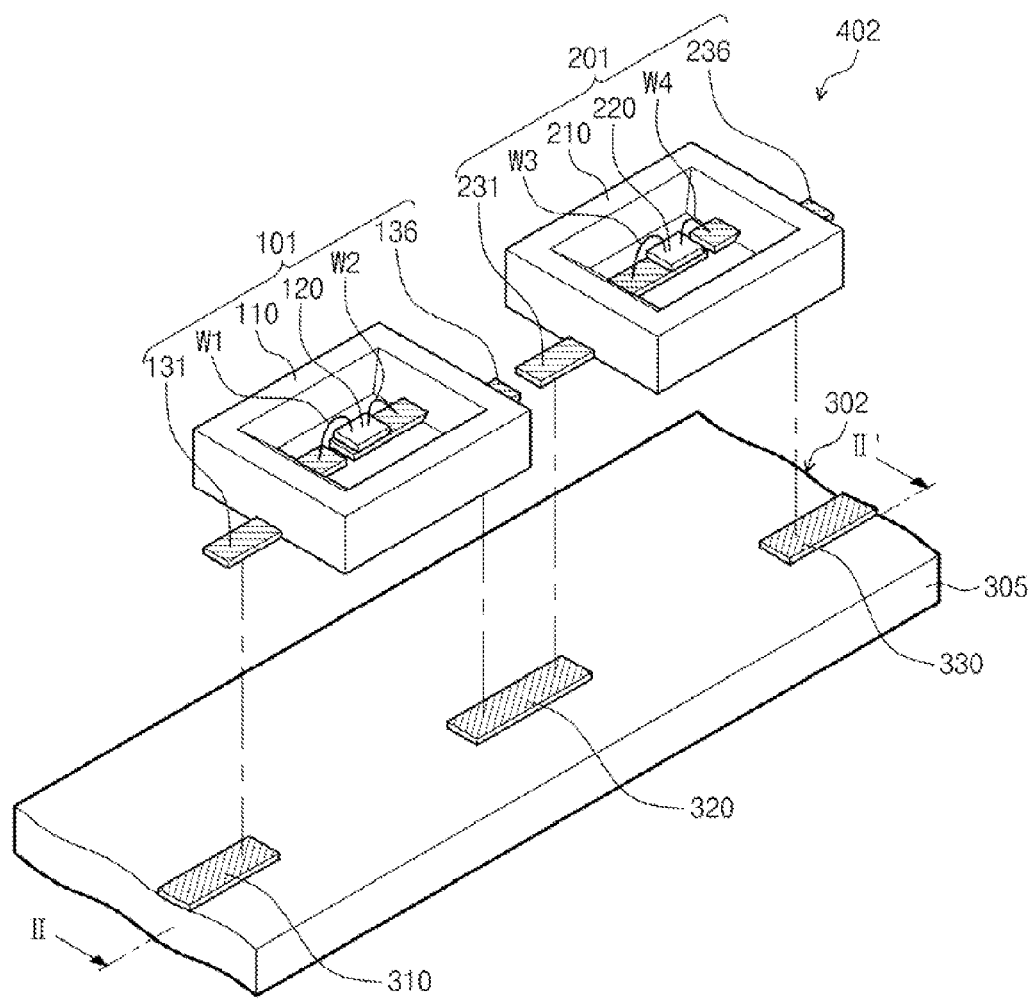
FIG. 4 is a perspective view showing a light emitting diode package according to another exemplary embodiment.
Figure 5:
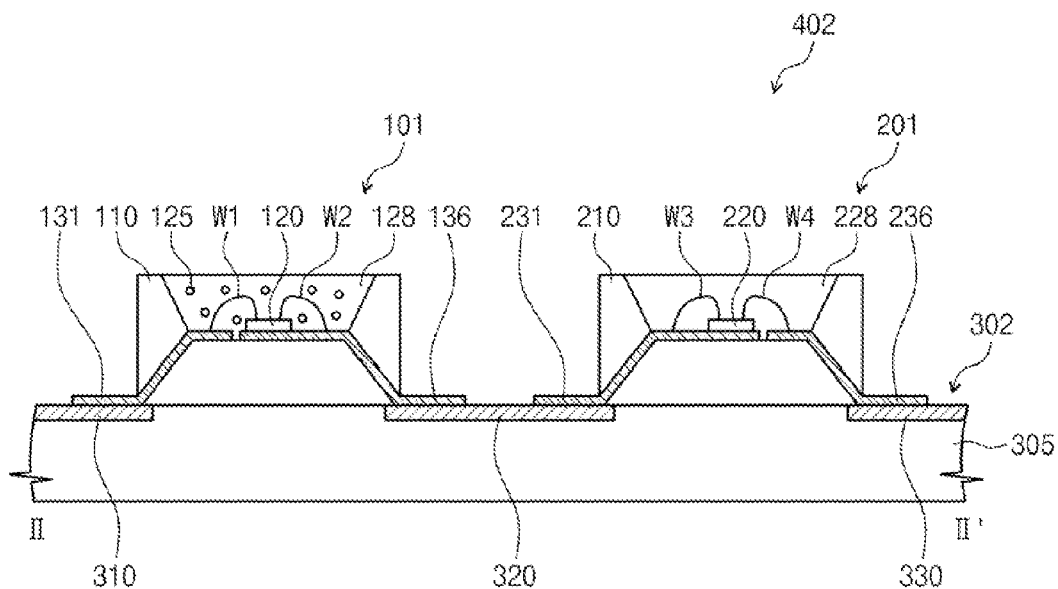
FIG. 5 is a cross-sectional view taken along a line II-II' of FIG. 4.

FIG. 4 is a perspective view showing a light emitting diode package according to another exemplary embodiment, and FIG. 5 is a cross-sectional view taken along a line II-II' of FIG. 4. In FIGS. 4 and 5, the same reference numerals denote the same elements in FIGS. 1 and 2, and thus detailed descriptions of the same elements will be omitted.

Referring to FIGS. 4 and 5, a light emitting diode package 402 includes a first light emitting unit 101, a second light emitting unit 202, and a circuit substrate 302.

The first light emitting unit 101 includes a first mold 110, a first light emitting diode 120, a first terminal 131, a second terminal 136, a first wire W1, a second wire W2, a first protective layer 128, and a fluorescent substance 125.

The first terminal 131 includes a first end spaced apart from the first light emitting diode 120 and accommodated in the first mold 110 and a second end withdrawn outside the first mold 110 and electrically connected to the first conductive pattern 310. In addition, the second terminal 136 includes a first end accommodated in the first mold 110 and disposed under the first light emitting diode 120 and a second end withdrawn outside the first mold 110 and electrically connected to the second conductive pattern 320.

The first wire W1 electrically connects the positive electrode of the first light emitting diode 120 to the first terminal 131 and the second wire W2 electrically connects the negative electrode of the first light emitting diode 120 to the second terminal 136.

According to the present exemplary embodiment shown in FIGS. 4 and 5, the second terminal 136 makes direct contact with the first light emitting diode 120 and absorbs the heat generated from the first light emitting diode 120. To this end, the second terminal 136 has a length longer than that of the first terminal 131.

The second light emitting unit 201 includes a second mold 210, a second light emitting diode 220, a third terminal 231, a fourth terminal 236, a third wire W3, and a fourth wire W4.

The third terminal 231 includes a first end accommodated in the second mold 210 and disposed under the second light emitting diode 220 and a second end withdrawn outside the second mold 210 and electrically connected to the second conductive pattern 320. In addition, the fourth terminal 236 includes a first end spaced apart from the second light emitting diode 220 and accommodated in the second mold 210 and a second end withdrawn outside the second mold 210 and electrically connected to the third conductive pattern 330.

The third wire W3 electrically connects the positive electrode of the second light emitting diode 220 to the third terminal 231 and the fourth wire W4 electrically connects the negative electrode of the second light emitting diode 220 to the fourth terminal 236.

Thus, the third terminal 231 makes directly contact with the second light emitting diode 220 and absorbs the heat generated from the second light emitting diode 220. To this end, the third terminal 231 has a length longer than that of the fourth terminal 236.

According to the first and second light emitting units 101 and 201, the second and third terminals 136 and 231 make directly contact with the first and second light emitting diodes 120 and 220, respectively, and the second and third terminals 136 and 231 are connected with the second conductive pattern 320. Thus, the second terminal 136 may absorb the heat generated from the first light emitting diode 120 instead of the first heat conduction member 132 shown in FIG. 2 and the third terminal 231 may absorb the heat generated from the second light emitting diode 220 instead of the second heat conduction member 232 shown in FIG. 2. In addition, the heat generated from the first and second light emitting diodes 120 and 220 may be maintained in the thermal equilibrium state by the second conductive pattern 320 instead of the third heat conduction member 340 shown in FIG. 2, and the heat may be discharged to the exterior through the second conductive pattern.

Meanwhile, the second terminal 136 and the third terminal 231 make contact with the second conductive pattern 320 according to the present exemplary embodiment in FIGS. 4 and 5. However, the second terminal 136, the third terminal 231, and the second conductive pattern 320 may be integrally formed with each other, or the second terminal 136 and the third terminal 231 may be integrally formed with each other after removing the second conductive pattern 320.

Figure 6:
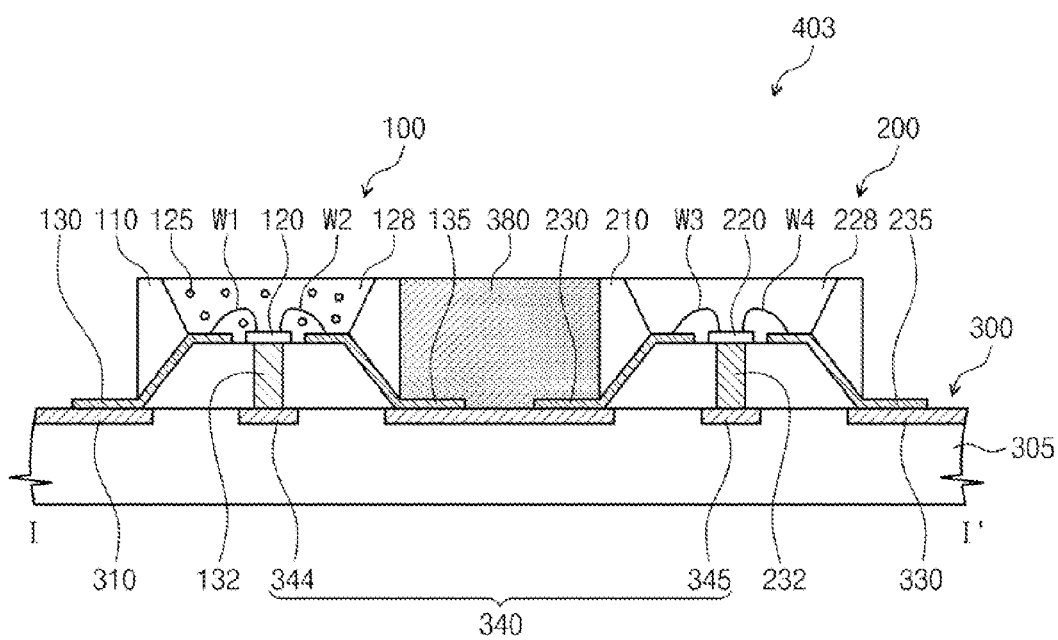
FIG. 6 is a cross-sectional view showing a light emitting diode package according to another exemplary embodiment.

FIG. 6 is a cross-sectional view showing a light emitting diode package according to another exemplary embodiment. In the present exemplary embodiment, a light emitting diode package 403 shown in FIG. 6 further includes a barrier 380 compared to the light emitting diode package 400 shown in FIGS. 1 and 2. Accordingly, the barrier 380 will be mainly described with reference to FIG. 6, and other elements in FIG. 6 will be assigned the same reference numerals in FIGS. 1 and 2. In addition, detailed descriptions of the same elements will be omitted.

Referring to FIG. 6, the light emitting diode package 403 includes the first light emitting unit 100, the second light emitting unit 200, the circuit substrate 300, and the barrier 380.

The barrier 380 is disposed between the first mold 110 and the second mold 210. In the present exemplary embodiment, the barrier 380 may include a polymer material such as polyphthalamide (PPA) and block the light emitted from the second light emitting unit 200 and traveling to the fluorescent substance 125.

Therefore, the light emitted from the second light emitting unit 200 may be prevented from being absorbed or scattered by the fluorescent substance 125. Consequently, the light emitted from the first light emitting unit 100 and the light emitted from the second light emitting unit 200 may be uniformly mixed with each other. Accordingly, the change of the color coordinate of the light emitted from the light emitting diode package 403 may be prevented.

Figure 7:
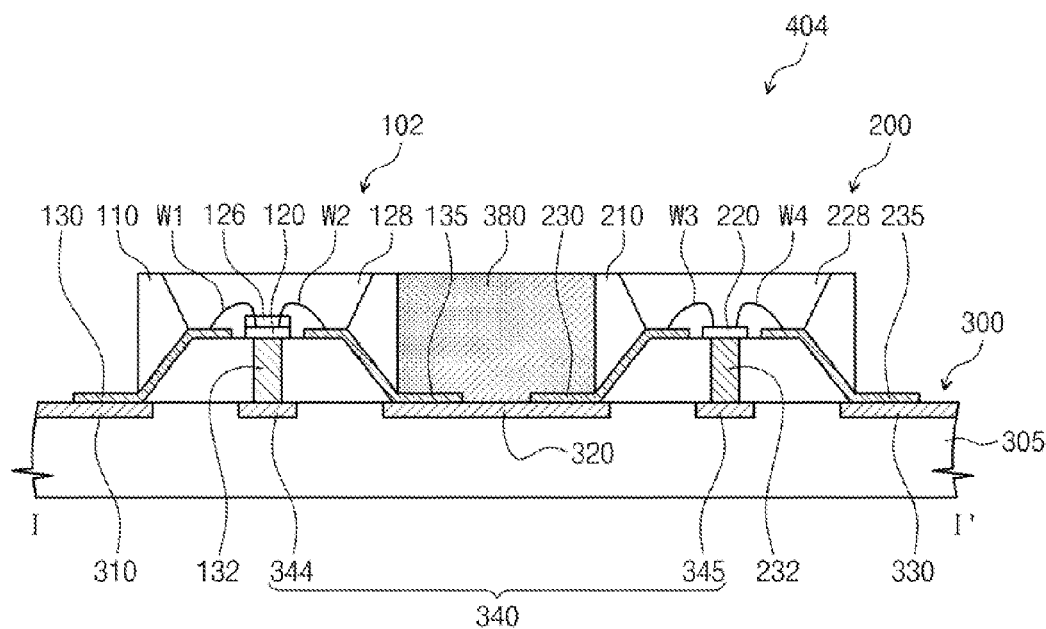
FIG. 7 is a cross-sectional view showing a light emitting diode package according to another exemplary embodiment.

FIG. 7 is a cross-sectional view showing a light emitting diode package according to another exemplary embodiment. In the present exemplary embodiment, a light emitting diode package 404 further includes a barrier 380 having the substantially same structure as the above-mentioned barrier 380 with reference to FIG. 6 and a fluorescent layer 126 instead of the fluorescent substance 125 shown in FIG. 1 compared to the light emitting diode package 400 shown in FIGS. 1 and 2. Thus, in FIG. 7, the same reference numerals denote the same elements in FIGS. 1, 2, and 6, and thus detailed description of the same elements will be omitted.

Referring to FIG. 7, the light emitting diode package 404 includes a first light emitting unit 102, a second light emitting unit 200, a circuit substrate 300, a barrier 380, and a fluorescent layer 126.

Different from the fluorescent substance 125 described with reference to FIGS. 1 and 2, the fluorescent layer 126 receives a part of a blue light emitted from the first light emitting diode 120 and converts the part of the blue light into a light having a wavelength different from that of the blue light.

As described above, in the case that the fluorescent layer 126 is disposed on the first light emitting diode 120, the amount of the light generated by the second light emitting unit 200 and absorbed or scattered by the fluorescent substance 125 (shown in FIG. 1) distributed in the first protective layer 128 may be reduced lower than the amount of the light absorbed or scattered by the fluorescent layer 126. Accordingly, the light emitted from the first light emitting unit 100 and the light emitted from the second light emitting unit 200 may be uniformly mixed with each other. Accordingly, the change of the color coordinate of the light emitted from the light emitting diode package 404 may be prevented.

Figure 9:
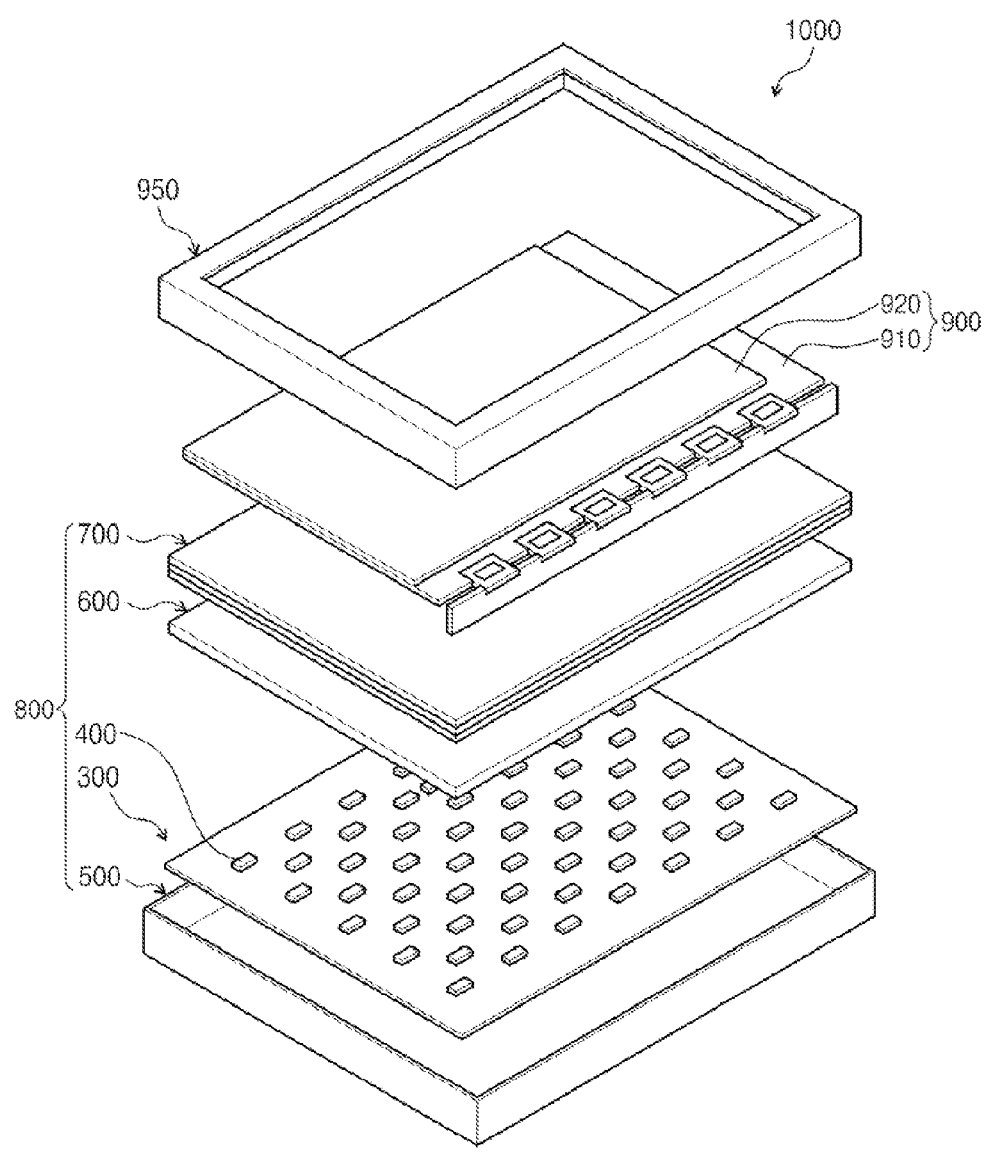
FIG. 9 is an exploded perspective view showing a display apparatus according to another exemplary embodiment.

FIG. 9 is an exploded perspective view showing a display apparatus according to another exemplary embodiment.

Referring to FIG. 9, a display apparatus 1000 includes a backlight assembly 800 that generates a light and a display panel 900 that receives the light to display an image.

The backlight assembly 800 includes a light emitting diode package 400 described with reference to FIGS. 1 and 2, a receiving container 500 that receives the light emitting diode package 400, a diffusion plate 600, and optical sheets 700.

Since the light emitting diode package 400 has the structure same as that of the light emitting diode package 400 described with reference to FIGS. 1 and 2, the detailed description of the light emitting diode package 400 will be omitted. Meanwhile, the light emitting diode package 400 is provided in plural on the circuit substrate 300.

The receiving container 500 includes a bottom and sidewalls extended from the bottom to provide the receiving space in which the circuit substrate 300 on which the light emitting diode package 400 is mounted is received. In addition, the receiving container 500 is coupled with a cover member 950 to firmly receive the light emitting diode package 400.

The diffusion plate 600 is disposed on the light emitting diode package 400 to diffuse the light generated by the light emitting diode package 400. The optical sheets 700 are disposed on the diffusion plate 600. In the present exemplary embodiment, the optical sheets 700 may include a prism film that condenses the light exiting from the diffusion plate 600 to improve front brightness and a diffusion film that diffuses the light exiting from the prism film.

The display panel 900 includes a first substrate 910 and a second substrate 920 facing the first substrate 910. The first substrate 910 includes a plurality of pixels (not shown), and each pixel may include a thin film transistor and a pixel electrode (not shown) electrically connected to the thin film transistor.

In addition, the second substrate 920 may include color filters (not shown) positioned at positions corresponding to the pixels, respectively. Further, in the case that the display panel 900 is for a liquid crystal display, the second substrate 920 may include a common electrode (not shown) that forms an electric field with the pixel electrodes.

Although the exemplary embodiments have been described, it is understood the subject matter described herein should not be limited to these exemplary embodiments but various changes and modifications can be made by one ordinary skilled in the art within the intended spirit and scope hereinafter claimed.

What is claimed is:
1. A backlight assembly comprising:
a first light emitting unit comprising a first light emitting diode, a first terminal electrically connected to a positive electrode of the first light emitting diode, a second terminal electrically connected to a negative electrode of the first light emitting diode, and a first heat conduction member, the first heat conduction member coupled to a thermally conductive area of the first light emitting diode to absorb a heat generated from the first light emitting diode;

a second light emitting unit comprising a second light emitting diode, a third terminal electrically connected to a positive electrode of the second light emitting diode, a fourth terminal electrically connected to a negative electrode of the second light emitting diode, and a second heat conduction member, the second heat conduction member coupled to a thermally conductive area of the second light emitting diode to absorb a heat generated from the second light emitting diode;

a third heat conduction member connected to the first heat conduction member and the second heat conduction member; and a receiving container receiving the first light emitting unit and the second light emitting unit.

2. The backlight assembly of claim 1, further comprising a circuit substrate electrically connected to the first light emitting unit and the second light emitting unit to supply a power source voltage to the first light emitting unit and the second light emitting unit, wherein the circuit substrate comprises:

an insulation part;

a first conductive pattern disposed on the insulation part and electrically connected to the first terminal;

a second conductive pattern disposed on the insulation part and electrically connected to the second terminal and the third terminal; and a third conductive pattern disposed on the insulation part and electrically connected to the fourth terminal.

3. The backlight assembly of claim 2, wherein the heat conduction member is disposed on the insulation part and spaced apart from the first conductive pattern, the second conductive pattern, and the third conductive pattern.

4. The backlight assembly of claim 2, wherein the heat conduction member passes through the insulation part and extended to a rear surface of the insulation part and is positioned on a surface of the insulation part, which is different from the first conductive pattern, the second conductive pattern, and the third conductive pattern.

5. The backlight assembly of claim 1, wherein the first light emitting unit further comprises:

a first mold receiving the first light emitting diode;

a first protective layer accommodated in the first mold to cover the first light emitting diode; and a fluorescent substance accommodated in the first mold to change a wavelength of a light provided from the first light emitting diode, and the second light emitting unit further comprises:

a second mold receiving the second light emitting diode; and a second protective layer accommodated in the second mold to cover the second light emitting diode.

6. The backlight assembly of claim 5, further comprising a barrier disposed between the first mold and the second mold to block the light generated by the second light emitting diode and traveling to the fluorescent substance.

7. The backlight assembly of claim 5, wherein the fluorescent substance is distributed in the first protective layer.

8. The backlight assembly of claim 5, wherein the fluorescent substance is spaced apart from the first protective layer and disposed between the first protective layer and the first light emitting diode.

9. The backlight assembly of claim 5, wherein the first light emitting diode emits a blue light, the second light emitting diode emits a green light, and the fluorescent substance receives the blue light to convert the blue light to a red light.

10. The backlight assembly of claim 1, wherein the first heat conduction member, the second heat conduction member, and the third heat conduction member are integrally formed with each other.

11. A backlight assembly comprising:

a first light emitting unit comprising a first light emitting diode, a first terminal electrically connected to a positive electrode of the first light emitting diode, and a second terminal electrically connected to a negative electrode of the first light emitting diode;

a second light emitting unit comprising a second light emitting diode, a third terminal electrically connected to a positive electrode of the second light emitting diode, and a fourth terminal electrically connected to a negative electrode of the second light emitting diode;

a receiving container receiving the first light emitting unit and the second light emitting unit; and a circuit substrate electrically connected to the first light emitting unit and the second light emitting unit to supply a power source voltage to the first light emitting unit and the second light emitting unit;

wherein the second terminal makes contact with the first light emitting diode, the third terminal makes contact with the second light emitting diode, and the second terminal faces the third terminal in an area between the first terminal and the forth terminal, wherein the circuit substrate comprises:

an insulation part;

a first conductive pattern disposed on the insulation part and electrically connected to the first terminal;

a second conductive pattern disposed on the insulation part and electrically connected to the second terminal and the third terminal; and a third conductive pattern disposed on the insulation part and electrically connected to the fourth terminal.

12. The backlight assembly of claim 11, wherein the first light emitting unit further comprises:

a first mold receiving the first light emitting diode;

a first protective layer accommodated in the first mold to cover the first light emitting diode; and a fluorescent substance accommodated in the first mold to change a wavelength of a light provided from the first light emitting diode, and the second light emitting unit further comprises:

a second mold receiving the second light emitting diode; and a second protective layer accommodated in the second mold to cover the second light emitting diode.

13. The backlight assembly of claim 12, further comprising a barrier disposed between the first mold and the second mold to block the light generated by the second light emitting diode and traveling to the fluorescent substance.

14. The backlight assembly of claim 12, wherein the fluorescent substance is distributed in the first protective layer.

15. The backlight assembly of claim 12, wherein the fluorescent substance is spaced apart from the first protective layer and positioned between the first protective layer and the first light emitting diode.

16. The backlight assembly of claim 12, wherein the first light emitting diode emits a blue light, the second light emitting diode emits a green light, and the fluorescent substance receives the blue light to convert the blue light to a red light.

17. The backlight assembly of claim 11, wherein the first light emitting unit further comprises:

a first wire that electrically connects a positive electrode of the first light emitting diode to the first terminal; and a second wire that electrically connects a negative electrode of the first light emitting diode to the second terminal, and the second light emitting unit further comprises:
a third wire that electrically connects a positive electrode to the third terminal; and
a fourth wire that electrically connects a negative electrode to the fourth terminal.

18. The backlight assembly of claim 11, wherein the second terminal and the third terminal are integrally formed with each other.

19. A light emitting diode package comprising:
a first light emitting unit comprising a first light emitting diode having first and second electrodes and a thermally conductive area the first light emitting unit further comprising a first heat conduction member, the first heat conduction member coupled to the thermally conductive area of the first light emitting diode to absorb a heat generated from the first light emitting diode;
a second light emitting unit comprising a second light emitting diode having first and second electrodes and a thermally conductive area, the second light emitting unit further comprising a second heat conduction member, the second heat conduction member coupled to the thermally conductive area of the second light emitting diode to absorb a heat generated from the second light emitting diode; and
a third heat conduction member connected to the first heat conduction member and the second heat conduction member.

20. A display apparatus comprising:
a backlight assembly generating a light; and
a display panel receiving the light to display an image,
wherein the backlight assembly comprises:
a first light emitting unit comprising a first light emitting diode, a first terminal electrically connected to a positive electrode of the first light emitting diode, and a second terminal electrically connected to a negative electrode of the first light emitting diode;
a second light emitting unit comprising a second light emitting diode, a third terminal electrically connected to a positive electrode of the second light emitting diode, and a fourth terminal electrically connected to a negative electrode of the second light emitting diode;
a receiving container receiving the first light emitting unit and the second light emitting unit;
a circuit substrate electrically connected to the first light emitting unit and the second light emitting unit to supply a power source voltage to the first light emitting unit and the second light emitting unit; and
wherein the second terminal makes contact with the first light emitting diode, the third terminal makes contact with the second light emitting diode, and the second terminal faces the third terminal in an area between the first terminal and the fourth terminal,
wherein the circuit substrate comprises:
an insulation part;
a first conductive pattern disposed on the insulation part and electrically connected to the first terminal;
a second conductive pattern disposed on the insulation part and electrically connected to the second terminal and the third terminal; and
a third conductive pattern disposed on the insulation part and electrically connected to the fourth terminal.

21. A backlight light emitting package comprising:
a first light emitting unit having first and second electrodes, a thermally conductive area, and a first heat conduction member extending from the thermally conductive area;
a second light emitting unit having first and second electrodes, a thermally conductive area, and a second heat conduction member extending from the thermally conductive area of the second light emitting unit; and
a heat connection member contacting the first and second heat conduction members and configured to absorb heat generated by the first light emitting unit and the second light-emitting unit of the backlight emitting package.

22. The backlight light emitting package of claim 21, wherein the heat connection member is not electrically connected to either the first light emitting unit or the second light emitting unit.

23. The backlight light emitting package of claim 21, wherein the heat connection member is at least partially exposed on an exterior surface of the backlight emitting package to discharge the heat absorbed from the first light emitting unit and the second light emitting unit away from the backlight light emitting package.

24. The backlight light emitting package of claim 21, wherein the heat connection member is connected to a first light emitting element of the first light emitting unit and a second light emitting element of the second light emitting unit.

25. The backlight light emitting package of claim 21, wherein the heat connection member is electrically connected to a first electrical conductive terminal of the first light emitting unit and to a first electrical conductive terminal of the second light emitting unit.

26. The backlight light emitting package of claim 24, wherein the first heat conduction member contacts the thermally conductive area and one of the electrodes of the first light emitting unit.

27. The backlight light emitting package of claim 26, wherein the second heat conduction member contacts the thermally conductive area and one of the electrodes of the second light emitting unit.

* * * * *